US009001141B2

(12) United States Patent
Glen et al.

(10) Patent No.: US 9,001,141 B2

(45) Date of Patent: Apr. 7, 2015

(54) METHOD AND APPARATUS FOR PROVIDING INDEPENDENT GAMUT REMAPPING FOR MULTIPLE SCREEN SUBSECTIONS

(71) Applicant: ATI Technologies ULC, Markham (CA)

(72) Inventors: David I. J. Glen, Toronto (CA); Jie Zhou, Richmond Hill (CA)

(73) Assignee: ATI Technologies ULC, Markham, Ontario (CA)

(*) Notice: Subject to any disclaimer, the term of this patent is extended or adjusted under 35 U.S.C. 154(b) by 158 days.

(21) Appl. No.: 13/625,208

(22) Filed: Sep. 24, 2012

(65) Prior Publication Data

US 2013/0076776 A1 Mar. 28, 2013

Related U.S. Application Data

(60) Provisional application No. 61/539,307, filed on Sep. 26, 2011, provisional application No. 61/540,319, filed on Sep. 28, 2011.

(51) Int. Cl.

| | |
|---|---|
| *G09G 5/00* | (2006.01) |
| *G09G 5/02* | (2006.01) |
| *G06F 15/16* | (2006.01) |
| *G09G 5/36* | (2006.01) |
| *H04N 5/202* | (2006.01) |
| *H04N 5/46* | (2006.01) |
| *H04N 5/445* | (2011.01) |
| *G03F 3/08* | (2006.01) |
| *G06K 9/00* | (2006.01) |
| *G06F 3/00* | (2006.01) |
| *G06F 3/048* | (2013.01) |
| *G09G 5/14* | (2006.01) |

(52) U.S. Cl.

CPC .. *G09G 5/02* (2013.01); *G09G 5/14* (2013.01); *G09G 2340/06* (2013.01)

(58) Field of Classification Search

USPC ......... 345/581, 589–590, 591, 593, 600, 606, 345/623–624, 629, 501, 502, 545, 549, 345/690; 348/254, 552, 557, 563–564, 567, 348/569; 358/518, 519, 523, 525, 537, 540; 382/167, 254, 305; 715/700, 764, 781, 715/797

See application file for complete search history.

(56) References Cited

U.S. PATENT DOCUMENTS

| | | | | |
|---|---|---|---|---|
| 5,416,890 | A * | 5/1995 | Beretta | 345/590 |
| 5,909,291 | A | 6/1999 | Myers et al. | |
| 2009/0303261 | A1 * | 12/2009 | Fard | 345/690 |
| 2012/0038938 | A1 * | 2/2012 | Oh et al. | 358/1.9 |
| 2012/0114234 | A1 | 5/2012 | Fard | |

FOREIGN PATENT DOCUMENTS

| | | | |
|---|---|---|---|
| EP | 2312431 | A1 | 4/2011 |
| WO | 2009/050846 | A1 | 4/2009 |

OTHER PUBLICATIONS

International Search Report from Canadian Patent Office; International Application No. PCT/CA2012/000884; dated Jan. 17, 2013.

* cited by examiner

*Primary Examiner* — Wesner Sajous

(74) *Attorney, Agent, or Firm* — Faegre Baker Daniels LLP

(57) ABSTRACT

An apparatus and method for providing display information generates, independently from an operating system, different screen subsections of a screen image using independent gamut remapping configurations to generate an output image in a target gamut space of a display. The method and apparatus also provides the generated output image for display or may display the generated output image.

20 Claims, 5 Drawing Sheets

METHOD AND APPARATUS FOR PROVIDING INDEPENDENT GAMUT REMAPPING FOR MULTIPLE SCREEN SUBSECTIONS

RELATED APPLICATIONS

This application claims priority to U.S. Provisional Application Ser. No. 61/539,307, filed Sep. 26, 2011, entitled "METHOD AND APPARATUS FOR PROVIDING INDEPENDENT GAMUT REMAPPING FOR MULTIPLE SCREEN SUBSECTIONS", having as inventors David I. J. Glen et al., and claims priority to U.S. Provisional Application Ser. No. 61/540,319, filed Sep. 28, 2011, entitled "METHOD AND APPARATUS FOR PROVIDING INDEPENDENT GAMUT REMAPPING FOR MULTIPLE SCREEN SUBSECTIONS", having as inventors David I. J. Glen et al., owned by instant assignee and is incorporated herein by reference.

BACKGROUND OF THE DISCLOSURE

The disclosure relates generally to apparatus and methods that perform gamut remapping.

Display apparatus, such as tablet devices, laptop computers, handheld devices, desktop computers and other display apparatus may provide screen displays that may display images in one or more different color gamut space. For example, display systems may display pixel information in a gamut space such as scRGB, AdobeRGB, Adobe wide gamut RGB and sRGB color gamut spaces. Some software applications and video players can support the wide color gamuts. However, apparatus typically do not display both sRGB gamut material and wider gamut material correctly on a personal computer screen at the same time.

For example, in some display systems, a user can calibrate the system to a specific color gamut using special tools. However, only one calibrated color profile can be active at a time and the specific color gamut is applied to the full screen. As such, if two windows are side by side, only one has a correct color gamut. For example, where a user has a window displaying video as well as a desktop window, the video may be considered an overlay window. However, the application of the gamut remapping operation is applied to the desktop window as well as the video window. Accordingly, each window or a screen subsection of a screen image has the same gamut remapping process assigned to the pixels displayed in the differing screen subsections. A user must manually switch to other profiles to change a color gamut but the full screen is changed. Also, running programs in a color gamut that the system does not natively support, results in incorrect colors for a particular application window where multiple application windows are displayed.

Another proposal detects an active application window (the one with current focus) and attempts to set the color gamut as optimized for that application that is presenting in the window. Clicking on a different window to bring it into focus, however, invokes a change of gamut remapping but the change applies to the full screen image. As a result, other windows showing on a desktop show incorrect colors.

Display apparatus may include one or more processors, such as a host CPU and a coprocessor such as a graphics processing core either on the same chip or in multiple chips and gamut remapping may be performed by, for example, the graphics processing core but such systems typically only use the same gamut remapping operation for the entire screen image. The gamut remapping that occurs by the graphics processing core may also be done in a display controller pipeline. However as noted above, such systems typically use the same gamut remapping operation for the entire screen image.

Accordingly, a need exists for an improved display apparatus and method that employ gamut remapping.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Figure 1:
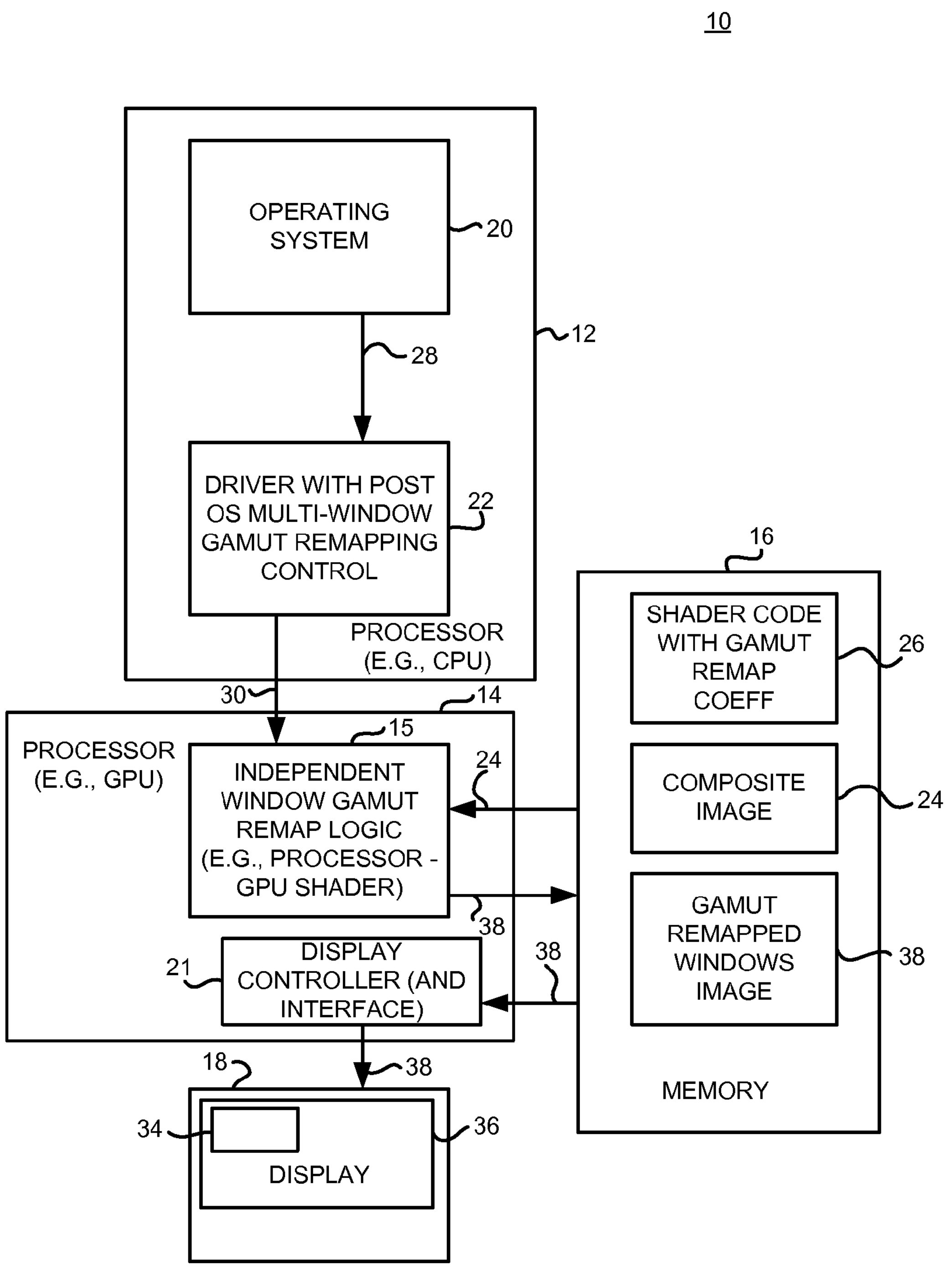
FIG. 1 is a block diagram illustrating one example of a display apparatus that employs independent gamut remapping regions in accordance with one embodiment of the disclosure.

Briefly, an apparatus and method for providing display information generates, independently from an operating system, different screen subsections, such as different windows, of the screen image using independent gamut remapping configurations to generate an output image in a target gamut space of a display. The apparatus and method also displays the output image on a display. In one example, independent gamut remapping is provided for different windows that are displayed at the same time on the display screen in a target gamut space of the display, by generating the windows having independent gamut remapping configurations, post operating system storage of a composite image (multi-window display surface) in memory. In one example, logic, such as a graphics processing core executes stored shader code that includes gamut remapping coefficients for different gamut remapping configurations. The gamut remapped windows are generated from the composite image data and may be stored in the frame buffer memory and then output to a display. In this example, a driver (e.g., CPU executing driver code) with post operating system multi-window gamut remapping control, controls the logic such as a programmable shader of a graphics processing core, or any other suitable logic, to generate different screen subsections of a screen. The logic selects from the first and second gamut remapping coefficients to perform gamut remapping for a first window using the first set of gamut remapping coefficients and performs gamut remapping on a second window using the second set of gamut remapping coefficients. Generating the independent gamut remapping configurations for each window may include selectively applying different gamut remapping configurations on a per-pixel or per-group of pixel basis for the different screen subsections independently from operating system control.

In one example, one screen subsection includes a video window and another screen subsection includes a graphic window such as a desktop window. Each of the video window and the desktop window have different configurations of gamut remapping applied. In another example a video overlay window is configured to have a different gamut remapping applied to it compared to a desktop window. Gamut remapping may include a 1:1 remapping operation where a window is generated by an application, for example in the same target gamut space as the display.

In another example, display output post processing is utilized by logic, such as a display controller in a graphics processing core, that utilizes an already composited display surface in the frame buffer and provides the different gamut remapping configurations to different screen subsections of the display surface between a time the operating system requests that the display surface be sent to the display and a time that the driver actually presents the display surface to the display. As such, the independent gamut remapping on different windows is performed in effect without the knowledge of the operating system. In this example, the logic (e.g., display controller) does not restore a composite image in the frame buffer as with the shader code example, but instead outputs the differently gamut remapped windows in the target gamut space of the display to the display controller without storing the gamut remapped windows back in the frame buffer.

Among other advantages, independent window gamut remapping is provided for different windows in a display surface or display frame by a mechanism independent of operating system control. An improved image quality is provided that allows a wide gamut video window to be properly presented at the same time a window with another color gamut is provided in the same display surface. As such, in one example, gamut remapping is provided by a graphics processing core to enable it to apply different remapping algorithms to different areas of a single screen image. Each window or screen subsection can have independent gamut remapping to the display gamut space. A video played back via an overlay path can have independent color gamut from a currently configured or default desktop color gamut. In one example, a display controller supports two different gamut remapping configurations, one for desktop and one for video overlay. Each pixel is flagged to be either a video overlay or desktop and then an appropriate gamut remapping operation is applied. In another solution, the region of the display that is provided by different applications may have different gamut remapping functions. The graphics processing core may be programmed with suitable shader code and be provided with suitable gamut remapping coefficients so that the graphics pipeline is employed to produce windows with differing gamut configurations.

FIG. 1 illustrates one example of an apparatus 10, such as but not limited to a tablet device, wireless handheld device, laptop, printer, television monitor including an HDTV monitor or any other suitable apparatus. In this example, the apparatus 10 will be described as being a laptop computer, however any suitable apparatus may be employed. In this example, the apparatus includes logic in the form of a first processor 12 (e.g., CPU core) such as a host CPU and independent window gamut remap logic 14, such as a graphics processing core. In this example, a programmable GPU shader 15 operates as the gamut mapping logic. The apparatus may include a display controller 21, as known in the art, that may be included in a graphics processing core. However any suitable logic may be employed such as but not limited to state machines, application specific integrated circuits, DSP, FPGA's, any suitable combination of hardware and/hardware that executes stored executable instructions. The apparatus 10 also includes memory 16 such as frame buffer memory, and/or system memory and/or other suitable memory, and a display 18. It will also be recognized that the described functionality may be employed in any suitable combination and in any suitable component such as the display 18. For purposes of simplicity, various well known elements of the apparatus 10 are not shown, such as suitable buses, additional memory, wireless transceivers and any other suitable circuitry.

The processor 12 may include an operating system 20 whose code may be stored in memory 16. Likewise, the processor 12 may also execute driver code 22 that may also be stored in memory 16 and is shown as being a driver with post operating system multi-window gamut remapping control. In this example, one or more applications that are operating on the processor use the operating system 20 to produce a display surface referred to as composite image 24 that is stored in, for example, frame buffer memory. The composite image 24 may include pixel data representing multiple different screen subsections or windows in one frame prior to performing the disclosed independent gamut remapping operation.

In this example, shader code 26 (e.g., part of driver code) that is executed by the logic 14 includes sets of gamut remap coefficients that provide differing gamut remapping configurations for different windows (screen subsections) in the image as set forth below. The operating system 20 communicates with the driver 22 using known communication information. In this example, the operating system through data 28 indicates to the driver 22 that the composite image is complete and ready for display without the operating system knowing that the logic performs gamut remapping operations on the composite image.

A user may set different gamut remapping configurations for different windows in a display surface through a graphic user interface provided by device 22. One gamut configuration may be for example to set a window from sRGB to Adobe RGB or from xvYCC to Adobe RGB or any other suitable gamut configuration. Alternatively, the driver 22 may automatically determine which window is a video overlay window and which window is a desktop or graphics window and cause the logic 14 to apply different gamut remapping configurations to each of the different windows (screen subsections) after the composite image has been stored in the frame buffer. The gamut conversion can be to any suitable gamut space including a custom gamut space native to a display.

In this example, the driver provides control information 30, such as data indicating which gamut space to convert a window to, to the logic 14 to inform the logic 14 to remap the color gamut of the pixels for the windows of the composite image 24 after the operating system 20 believes that the composite image 24 is ready for display on display 18. Accordingly, in this example, the logic 14 (e.g., GPU shader 15) provides post operating system generation of different screen subsections of the screen image that have different gamut remapping configurations. These are shown as being displayed on display 18 as gamut remapped window 34 and gamut remapped window 36.

In this example, these windows or screen subsections that have independent gamut remapping configurations are generated by the logic 14 using remap coefficients that are embedded in the stored shader code. However, they can be provided in any suitable manner. Once the different screen subsections of a screen image that have independent gamut remapping configurations are generated, they are output by the logic 14 and restored as a gamut remapped windows image 38, for example, in frame buffer memory. The display controller 21 then outputs the gamut remapped windows image 38 as an output image to the display 18. The different gamut remapped windows 34 and 36 are displayed each having an different independent gamut remap configuration compared to their pre-remap version. For example, if window or screen subsection 34 is a video window, it may have a wider gamut configuration (e.g., xvYCC) than, for example, window 36 which may be a desktop surface (e.g., sRGB). The output image 38 is in a target gamut space (e.g., Adobe RGB) of the display but includes windows that were gamut remapped independently.

Figure 2:
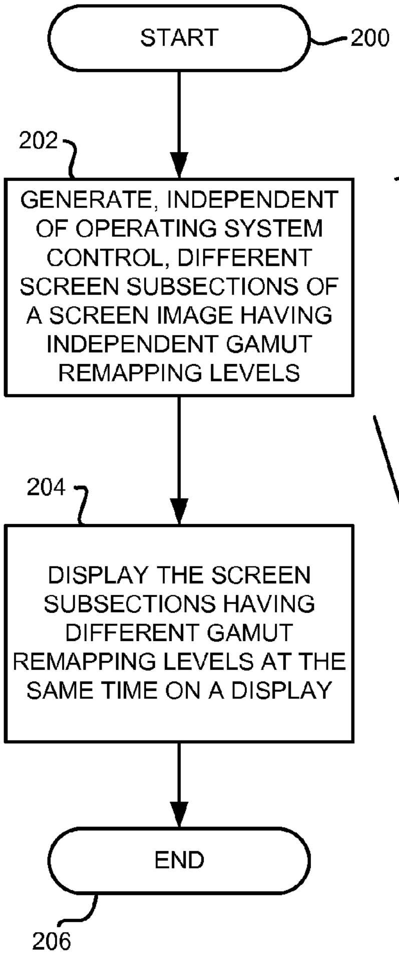
FIG. 2 is a flowchart illustrating one example of a method for providing display information in accordance with one embodiment of the disclosure.

Referring also to FIG. 2, a method for providing display information, such as a display image, will be described with reference to FIG. 1. As shown in block 200, the method includes determining that multiple screen subsections are to be provided with different configurations of gamut remapping. This may be done, for example, by the driver 22 based on knowledge of an application type that is producing each of the windows. An application providing a video is deemed as producing a video window and another application being a desktop window or graphic window. Alternatively, the windows (screen subsections) can be designated by a user through a suitable graphic user interface so that the driver knows which window is to receive the given configuration of gamut remapping. Any other suitable technique may also be employed.

As shown in block 202, the method includes generating, independently of an operating system, different screen subsections of a screen image having independent gamut remapping configurations. This may be done, for example, by logic 14 under control of the driver, by way of example. These are shown in FIG. 1 as screen subsection windows 34 and 36 by way of example. As shown in block 204, the method includes displaying the screen subsections having different gamut remapping configurations at the same time on a display. This is shown in FIG. 1 and may be done, for example, by the display 18 which may be any suitable monitor or other display device. As shown in block 206, the process is complete. The method may continue to generate different screen subsections having independent gamut remapping configurations independent of an operating system control if, for example, the windows 34 and 36 change due to other applications operating or an application closing. As shown in FIG. 1, the processor (logic 14 in this example) may also composite the different screen subsections in a gamut remapped windows image 38 (a display surface) for display.

Figure 4:
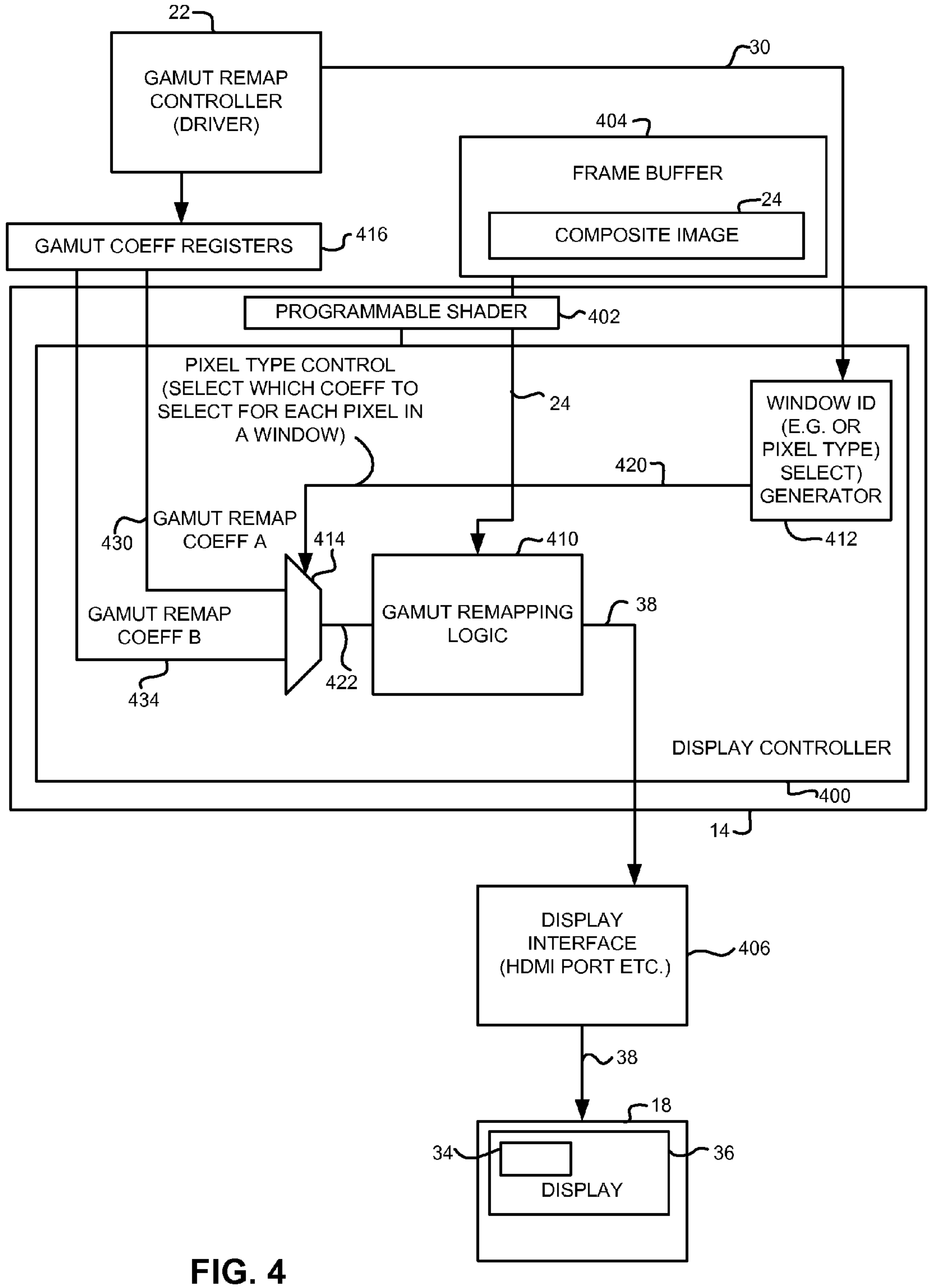
FIG. 4 is a block diagram of an apparatus that employs multiple window independent gamut remapping in accordance with one embodiment of the disclosure.

Referring also to FIG. 4, logic 14 employs a display controller 400 that may be, for example, part of a graphics processor core or any other suitable logic. Different from the description above with respect to the shader code 26, the embodiment shown in FIG. 4 need not employ the programmable shader 402 to perform the generation of the independent gamut remapped windows. Instead, the display pipeline (as opposed to a graphics pipeline) may perform the gamut remapping after a display surface, such as a composite image 24, has been presented for display by the display controller from the perspective of the operating system. Without the operating system's knowledge, the display controller 400 may generate the different screen subsections 34 and 36 having independent gamut remapping configurations as part of a display pipeline operation so that the resulting gamut remapped windows 34 and 36 need not be restored in the frame buffer 404 prior to being output to a display interface 406, such as an HDMI port or any other suitable display interface. In this example, the display controller 400 utilizes gamut remapping logic 410, window identification generator logic 412, gamut remap coefficient select logic 414 and memory 416, such as one or more registers that store different sets of gamut coefficients for differing gamut configurations. The memory 416 may be employed as part of a graphics processing core, may be part of a CPU core, may be part of a general purpose memory or any other suitable memory. The driver 22 provides control data 30 which may include window identification information. The window identification information may include overlay screen location information, overlay size, extents of each window identifier and front and back window ordering information which may be provided by a driver as known in the art. The window ID generator 14 generates pixel type control data 420 to control the gamut remap coefficient select logic 14 to provide different gamut remap coefficients 422 to the gamut remapping logic 410 depending upon which window or screen subsection the display controller 400 is outputting for the display interface 406 as determined from the control data 30.

The gamut remapping logic 410 obtains pixels corresponding to the composited desktop image 24 that includes at least two windows. This information is shown as information 24. The window ID generator 412 selects which coefficients should be applied to which pixels of the composite desktop image based on, for example, a window ID. By way of illustration, if a window ID indicates that the window is a video overlay that is being obtained by the display controller from the frame buffer, the window ID generator 412 may select gamut remap coefficients A designated as coefficients 430 which are then used to provide gamut remapping for the pixels in window A based on a per-pixel or block of pixels basis. The resulting gamut remapped pixels 38 are output to the display interface 406. When the window ID generator 412 detects that the pixels that are obtained by the display controller correspond to a different window requiring a different gamut remap configuration, the window ID generator 412 selects, for example, the other set of gamut remap coefficients 434 from the gamut coefficient register or memory 416. These are then used by the gamut remapping logic 410 to generate the second remapped window. The gamut remap controller 22 may suitably populate the memory 416 with the sets of gamut coefficient registers.

The gamut remapping logic 410 remaps at least two windows to provide different gamut configurations based on remap coefficients 430 and 434 provided by the gamut remap coefficient select logic 414. The gamut remapping logic outputs the resulting gamut remapped pixels 38 without restoring them in the frame buffer, in one example. The display 18 displays the screen subsections 34 and 36 having different gamut remapping configurations at the same time.

As shown, the programmable shader 402 may be used to generate the composited desktop image 24 as known in the art and therefore may have access to the frame buffer but in this embodiment does not perform the gamut remapping. The composited desktop image 24 is shown to be provided to the gamut remapping logic 410 which may be done through any suitable communication link as known in the art.

The memory 416 (e.g., part of apparatus memory 16) stores the at least first and second gamut remapping coefficients 430 and 434 for different gamut remapping configurations. The logic 14 generates different screen subsections of a screen image having independent gamut remapping configurations by selecting from at least the first and second gamut remapping coefficients and in this example is shown to use selection logic 414, to perform gamut remapping for a first window using a first set of gamut remapping coefficients 430 and to perform gamut remapping on a second window using the second set of gamut remapping coefficients 434. It will be recognized that any suitable number of sets of gamut coefficients as known in the art may be employed depending upon a number of different windows desired to be independently controlled. The logic 14 generates different screen subsections of the screen image having independent gamut remapping configurations by selectively applying the different gamut remapping configurations on a per-pixel or group of pixels basis for the different screen subsections independently from an operating system. Stated another way, the operating system does not instruct the logic to perform independent window gamut remapping.

In this example, the window ID is used by the logic to identify which window is to have its pixels remapped using certain remap coefficients. In one example, the screen subsection may be a video overlay window and another screen subsection that has a different configuration of gamut remapping may be a graphic window which contains graphics information such as a desktop window or any other suitable window. In this example, the logic 14 is operative to use window identification information to produce control information 420 to select which coefficients to apply to pixels of a particular window. Alternatively, other data may be employed such as application type information indicating which application is generating a particular window, or any other suitable control information. In this example, logic may include the driver 22 which may be, for example, a CPU executing driver code as well as logic 14 which may be a processor such as a graphics processing core or any other suitable processor wherein the processor is responsive to the driver. The driver provides control data 30 for the processor and in response, the processor generates the different screen subsections 34 and 36 having different gamut remapping configurations. In the embodiment shown in FIG. 4, the processor or logic 14 need not store gamut remapped windows in the frame buffer. Instead, the data is output in the suitable format to a suitable display interface 406 directly from the display controller 400. As such, the different screen subsections that have different gamut remap configurations are generated without writing the different screen subsections to the frame buffer prior to display. The window ID generator 412 may be any suitable logic including, for example, a state machine. The gamut remapping logic 410 may be any suitable logic including, for example, a state machine, programmed processor or any other suitable logic. The selecting logic 414 may be, for example, multiplexing logic or any other suitable selecting logic.

Figure 3:
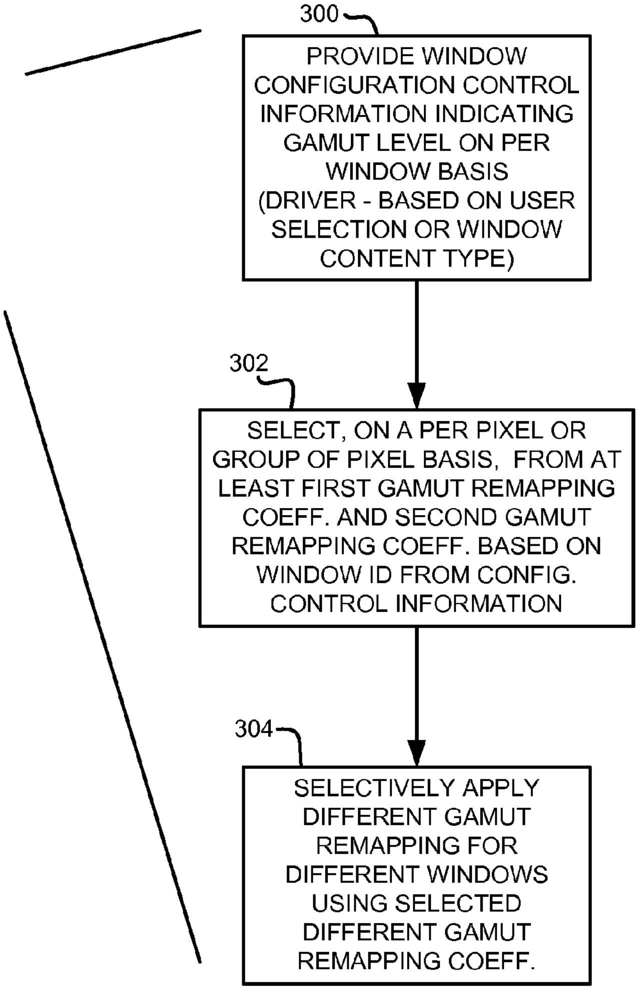
FIG. 3 is a flowchart illustrating in more detail portions of a method for providing display information in accordance with one embodiment of the disclosure.

Referring back to FIG. 3, generating, independent of operating system control, different screen subsections of a screen image such as a display surface, having independent gamut remapping configurations may include providing window configuration control information 30 indicating the gamut configuration to be provided on a per-window basis. For example, the driver may indicate which window includes which content type, such as video or graphics which is then used by the window ID generator to select which coefficients to use. This is shown in blocks 300 and 302. The gamut remapping logic 410 selectively applies different gamut remapping for different windows using the selected different gamut coefficients from the select logic 414. This is shown in block 304. As part of system setup, the method may include storing the first and second sets of gamut remapping coefficients in memory 416 and using the window identification information 30 to generate the different screen subsections 34 and 36 having different gamut remapping configurations. The window identification information 30 may represent whether a window contains video or desktop data.

Figure 5:
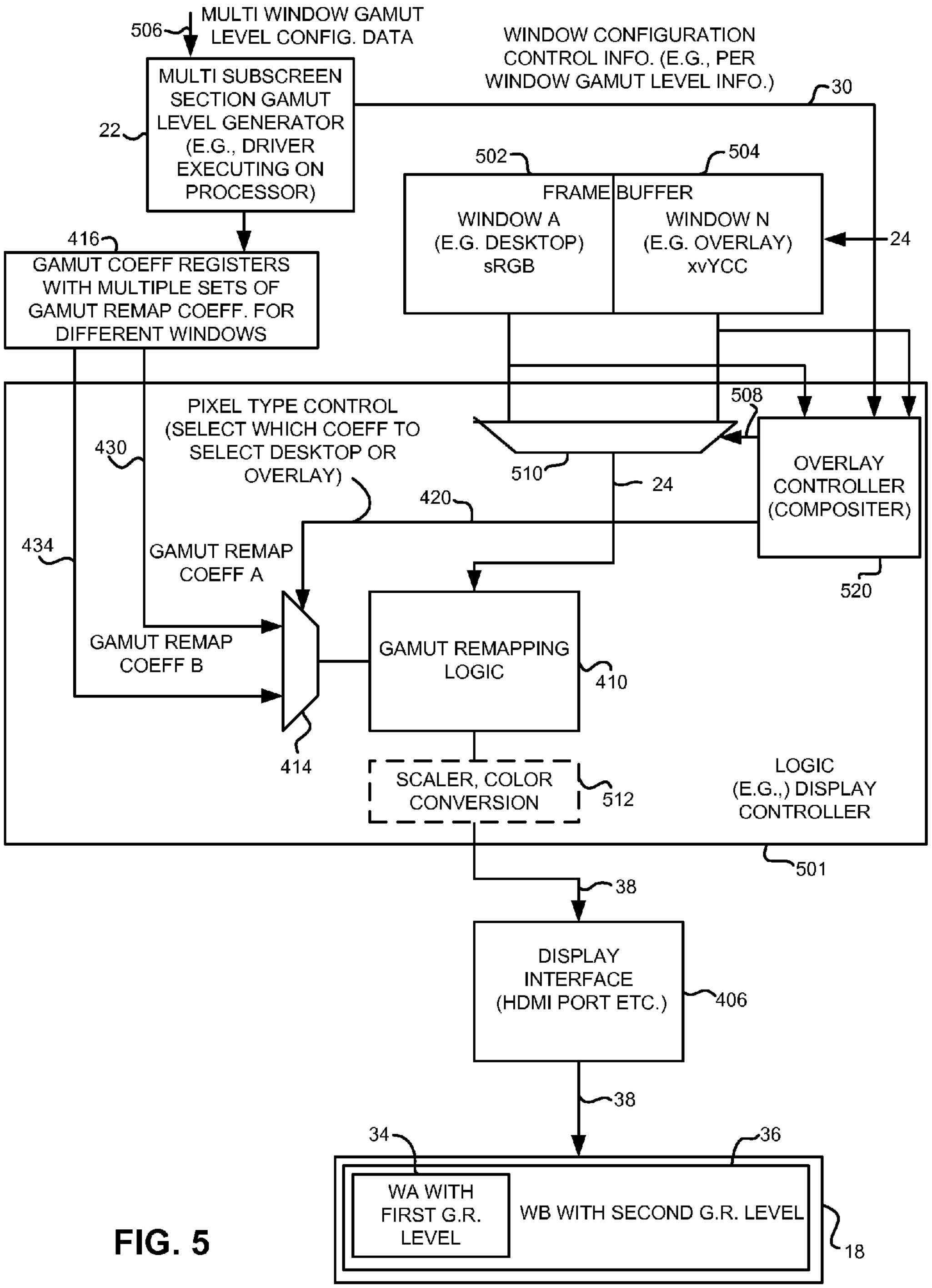
FIG. 5 is a block diagram of an apparatus that employs multiple window independent gamut remapping in accordance with one embodiment of the disclosure.

FIG. 5 is a block diagram illustrating another example of an apparatus wherein an overlay controller is used to composite an overlay window with other windows as part of logic 501 shown to be a display controller block. In this example, only two windows are described. In this example, a display surface is stored in the frame buffer and it includes a first window 502 such as a desktop window and an overlay window 504 such as a video overlay window. The window configuration control information 30 indicates on a per window basis the gamut configuration desired as determined based on the multi-window gamut configuration data 506 that may be, for example, input from a graphic user interface indicating that a video window should have a wider gamut configuration than the desktop window. The driver then uses this information to identify which of the windows 502 or 504 gets which gamut configuration. The display surface windows 502 and 504 are evaluated by the overlay controller 520 which then selects which of the pixels from which pre-gamut configuration corrected window 502 or 504 is passed to the gamut remapping logic as indicated by control information 508 to selection logic 510. The selected pixel information may indicate, for example, a pixel type indicating a desktop pixel type or an overlay pixel type. The overlay controller 520 causes the compositing of the windows, as known in the art, but instead also controls selection of the gamut remapping coefficients on a per pixel or group of pixel basis. The logic may also include a scaler and color conversion block 512 if desired to scale or otherwise color convert the gamut remapped pixel information produced by the gamut remapping logic 410. The resulting windows with first and second configuration gamut configurations are shown as windows 34 and 36. In this example, window 36 is the desktop window whereas window 34 is the video overlay window.

In this example, the display controller can read from two memory surfaces, one referred to as desktop and the other as overlay. Overlay may normally be used for video but could be used for graphics as well. Any video played back via the overlay path in the graphics core, for example, can have independent color gamut from the current configured desktop color gamut. As shown above, this is accomplished by having, for example, the display controller 501 support two different gamut remapping configurations, one for desktop and one for overlay. The overlay controller flags each pixel to be of either type (either in the desktop surface or the overlay surface) and then the appropriate gamut remapping is applied by selecting the appropriate gamut remap coefficients via control information 420. Among other advantages, multiple applications can appear at once on a wide gamut display device, each showing their correct color space. The above techniques do not require operating system support.

Figure 6:
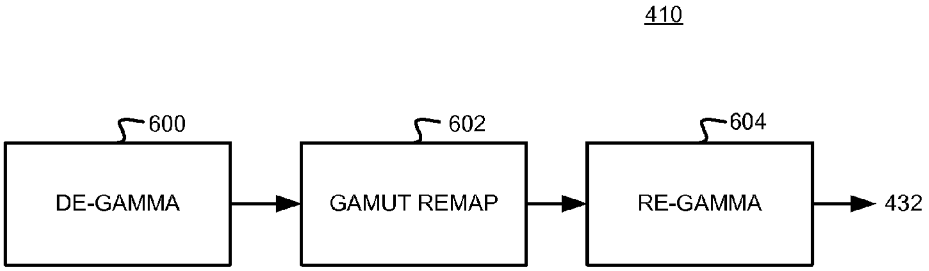
FIG. 6 is a block diagram illustrating an example of a gamut remapper in accordance with one embodiment of the disclosure.

FIG. 6 illustrates one example of a gamut remapping logic 410 which may be a known gamut remapper that employs a de-gamma block 600, a gamut remapping block 602 and a re-gamma block 604. As known in the art, the gamut remapping block may be a matrix such as a 3×3 matrix that can transform from an input gamut space to an output gamut space. Gamut remapping logic as noted above may be implemented as a state machine, suitably programmed processor or any other suitable logic. The gamut remapping logic 410 performs a de-gamma operation using de-gamma block 600 on pixel information 424 to produce de-gamma pixel information. It also performs gamut remapping using the gamut remap logic 602 on the de-gamma pixel information to produce gamut remapped pixel information. The gamut remapping logic 410 performs a re-gamma operation on the gamut remapped pixel information to produce the gamut remapped information 432. This may be performed on a per-pixel configuration or block of pixels configuration basis as desired. It will be recognized that the gamut remapping operation may include a 1:1 remapping if desired. Also, as used herein, the target gamut space of the display is considered to be the active gamut space of the display. It will also be recognized that other known techniques may be employed such as using three-dimensional transform tables or any other suitable technique.

The memory 16 may include non-transitory computer readable such as CDROMs, RAMs, ROM, or any other suitable storage medium and as known in the art, may be in any suitable configuration such as registers, frame buffer memory, system memory or other suitable configuration. In this example, executable instructions such as shader code with gamut remap coefficients, may cause one or more processors, such as a graphics processing core to generate, independent of operating system control, different screen subsections of a screen image having independent gamut remapping configurations and to provide the screen subsections having different gamut remapping configurations for display at the same time on a display. The executable instructions may also cause any other suitable portion of a processor to perform the operation. The memory may include the driver code 22 as well as any other suitable code as desired. Also, the executable instructions may cause the logic 14, for example, to select from a first and second gamut remapping coefficients to perform gamut remapping for different windows. Likewise, the executable instructions may cause the one or more processors to store the remapping coefficients in memory such as memory 416 and use window identification information to generate the different screen subsections having different gamut remapping configurations as provided by logic 14 for example wherein logic 14 is comprised of one or more processors.

Among other advantages, independent window gamut remapping is provided for different windows in a display surface or display frame by a mechanism independent of operating system control. An improved image quality is provided that allows a wide gamut video window to be properly presented at the same time a window with another color gamut is provided in the same display surface. As such, in one example, gamut remapping is provided by a graphics processing core to enable it to apply different remapping algorithms to different areas of a single screen image.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein. For example, operations of FIG. 5 can be combined with operations of FIG. 1 or FIG. 4. For example, the desktop window could be treated as the composite image 24 of FIG. 1. Also element 520 could decide with a desktop window to apply different remapping coefficients. Other suitable combinations of operations may also be employed.

What is claimed is:

1. A method for providing display information comprising:

generating, independent of operating system control, different screen subsections of a screen image using independent gamut remapping configurations to generate an output image in a target gamut space of a display, wherein generating the different screen subsections comprises selecting from at least first and second gamut remapping coefficients and performing gamut remapping for a first screen subsection using the first set of gamut remapping coefficients and performing gamut remapping on a second screen subsection using the second set of gamut remapping coefficients.

2. The method of claim 1 comprising displaying the generated output image on a display.

3. The method of claim 1 wherein the first screen subsection comprises a first window and the second screen subsection comprises a second window.

4. The method of claim 1 wherein generating different screen subsections of a screen image having independent gamut remapping configurations comprises selectively applying different gamut remapping configurations on a per pixel or per group of pixel basis for the different screen subsections independently from an operating system.

5. The method of claim 1 wherein generating different screen subsections of a screen image having independent gamut remapping configurations comprises providing a different configuration of gamut remapping for a video overlay window and a different configuration of gamut remapping for a graphic window.

6. The method of claim 1 comprising storing the first and second sets of gamut remapping coefficients in memory and using window identification information to generate the different screen subsections having different gamut remapping configurations.

7. The method of claim 6 wherein the window identification information represents whether a window contains video or graphics data.

8. The method of claim 1 wherein performing gamut remapping comprises performing a de-gamma operation on pixel information to produce de-gamma pixel information, performing gamut remapping on the de-gamma pixel information to produce gamut remapped pixel information and performing a re-gamma operation on the gamut remapped pixel information.

9. The method of claim 1 wherein generating, independent of operating system control, the different screen subsections of a screen image having independent gamut remapping configurations comprises generating the gamut remapped screen subsections having independent gamut remap configurations without writing the gamut remapped screen subsections to a frame buffer prior to display.

10. An apparatus comprising:

logic operative to generate, independently from operating system control, different screen subsections of a screen image using independent gamut remapping configurations to generate an output image in a target gamut space; and memory that stores at least first and second gamut remapping coefficients for different gamut remapping configurations, the memory operatively coupled to the logic, and wherein the logic is operative to generate different screen subsections of a screen image having independent gamut remapping configurations by selecting from the at least first and second gamut remapping coefficients to perform gamut remapping for a first screen subsection using the first set of gamut remapping coefficients and perform gamut remapping on a second screen subsection using the second set of gamut remapping coefficients.

11. The apparatus of claim 10 wherein first screen subsection comprises a first window and the second screen subsection comprises a second window.

12. The apparatus of claim 10 wherein the logic is operative to generate different screen subsections of a screen image having independent gamut remapping configurations by selectively applying different gamut remapping configurations on a per pixel or per group of pixel basis for the different screen subsections independently from an operating system.

13. The apparatus of claim 10 wherein the logic is operative to generate different screen subsections of a screen image having independent gamut remapping configurations by providing a different configuration of gamut remapping for a video overlay window and a different configuration of gamut remapping for a graphic window.

14. The apparatus of claim 10 wherein the logic is operative to use window identification information to generate the different screen subsections having different gamut remapping configurations.

15. The apparatus of claim 10 wherein the logic is comprised of a driver and a processor that is operatively responsive to the driver wherein the driver provides control data for the processor and in response the processor generates the different screen subsections having different gamut remapping configurations and wherein the processor composites the different screen subsections for display.

16. The apparatus of claim 10 wherein the logic comprises:

gamut remap coefficient select logic operative to provide different gamut remap coefficients for different screen subsections;

gamut remapping logic operatively coupled to the gamut remap coefficient select logic;

memory, operatively coupled to the gamut remapping logic, comprising a composited image comprising at least two windows with a same gamut configuration; and wherein the gamut remapping logic remaps the at least two windows to comprise different gamut configurations based on remap coefficients provided by the gamut remap coefficient select logic.

17. The apparatus of claim 10 comprising a display operatively coupled to the logic and operative to display the screen subsections having different gamut remapping configurations at the same time.

18. A non-transitory computer readable medium that comprises executable instructions that when executed by one or more processors causes the one or more processors to:

generate, independent of operating system control, different screen subsections of a screen image using independent gamut remapping configurations to generate an output image in a target gamut space of a display;

select from at least first and second gamut remapping coefficients to perform gamut remapping for a first window using the first set of gamut remapping coefficients and perform gamut remapping on a second window using the second set of gamut remapping coefficients; and provide the output image for display on a display.

19. The computer readable medium of claim 18 comprising executable instructions that when executed by one or more processors causes the one or more processors to selectively applying different gamut remapping configurations on a per pixel or per group of pixel basis for the different screen subsections independently from an operating system.

20. The computer readable medium of claim 18 comprising executable instructions that when executed by one or more processors causes the one or more processors to store the first and second sets of gamut remapping coefficients in memory and use window identification information to generate the different the screen subsections having different gamut remapping configurations.

* * * * *